United States Patent [19]
Martin

[11] Patent Number: 5,818,259
[45] Date of Patent: Oct. 6, 1998

[54] LOW VOLTAGE LOGIC CIRCUIT

[75] Inventor: Brian Clark Martin, Albuquerque, N. Mex.

[73] Assignee: Philips Electronics North America Corporation, New York, N.Y.

[21] Appl. No.: 565,695

[22] Filed: Nov. 30, 1995

[51] Int. Cl.[6] .................. H03K 19/0175; H03K 19/082
[52] U.S. Cl. .............. 326/84; 326/85; 326/110; 326/109; 326/17
[58] Field of Search .................. 326/110, 109, 326/83, 84, 85, 89, 91, 17

[56] References Cited

U.S. PATENT DOCUMENTS

| | | | |
|---|---|---|---|
| 4,558,234 | 12/1985 | Suzuki et al. | 326/84 |
| 4,602,269 | 7/1986 | Koike | 326/84 |
| 4,638,186 | 1/1987 | McLaughlin | 326/84 |
| 4,649,294 | 3/1987 | McLaughlin | 326/84 |
| 4,694,202 | 9/1987 | Iwamura et al. | 326/84 |
| 4,730,132 | 3/1988 | Watanabe et al. | 326/84 |
| 5,111,076 | 5/1992 | Tarng | 326/84 |
| 5,166,551 | 11/1992 | Kamuro | 326/84 |

*Primary Examiner*—Edward P. Westin
*Assistant Examiner*—Richard Roseen
*Attorney, Agent, or Firm*—Brian J. Wieghaus

[57] ABSTRACT

A BiCMOS logic circuit having greater drive and speed at low voltage is provided. The logic circuit includes a switching device which allows the pull-down device of the logic circuit to be driven directly by an input signal without first having to switch a MOS device. The switching device conducts current between the input terminal of the logic device and the pull-down device when the output signal equals a certain value.

43 Claims, 6 Drawing Sheets

LOW VOLTAGE LOGIC CIRCUIT

BACKGROUND OF THE INVENTION

This invention is directed to a digital logic circuit and, relates more particularly to a BiCMOS logic circuit having greater drive and speed at low voltage than conventional BiCMOS logic circuits.

A conventional BiCMOS logic circuit is designed to use the gain of the bipolar stage to improve the speed and drive of the CMOS elements. A BiCMOS circuit operating in the typical 5 volt supply range has a distinct advantage over pure CMOS circuitry with equivalent device geometries due to the increased speed and drive. As the operating voltage decreases to 3 volts and below, the BiCMOS circuit performance drops significantly due to the voltage drop across the emitter-base junction of the bipolar devices. BiNMOS and quasi-complementary BiCMOS designs have been used as low-voltage alternatives to standard BiCMOS.

Figure 1:
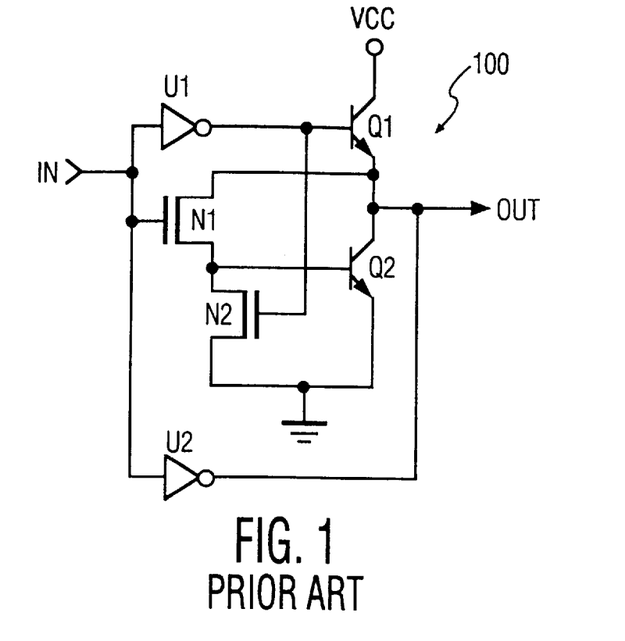
FIG. 1 is a circuit diagram of a prior art BiCMOS logic circuit.

An example of a standard BiCMOS inverter 100 is shown in FIG. 1. A transistor Q1, driven by CMOS inverter U1, provides the pull-up and a transistor Q2, driven by NMOS transistor N1, provides the pull-down. A small CMOS inverter U2 is placed in parallel with the BiCMOS circuit to pull the output completely to ground or $V_{cc}$. While this circuit provides superior performance at $V_{cc}$=5 volts, the standard BiCMOS circuit loses considerable speed, especially in a high-to-low transition as $V_{cc}$ decreases to 3 volts and below. In order for transistor Q2 to pull-down the output, N1 must conduct sufficiently to supply the necessary base drive, meaning that N1 would have to have a sufficient gate-to-source voltage ($V_{gs}$). For example, if N1 had a threshold of 0.8 volts and Q2 required a base-emitter drop of 0.7 volts, the input voltage would have to exceed 1.5 volts in order for the output to be pulled low. If the input signal swing is only 3 volts, then the input is halfway through its low-to-high transition before the pull-down begins to conduct. Additionally, if another BiCMOS driver were generating the input signal, the dynamic high signal would only be $V_{cc}$-$V_{be}$ or approximately 2.3 volts further decreasing the speed at the output.

Figure 2:
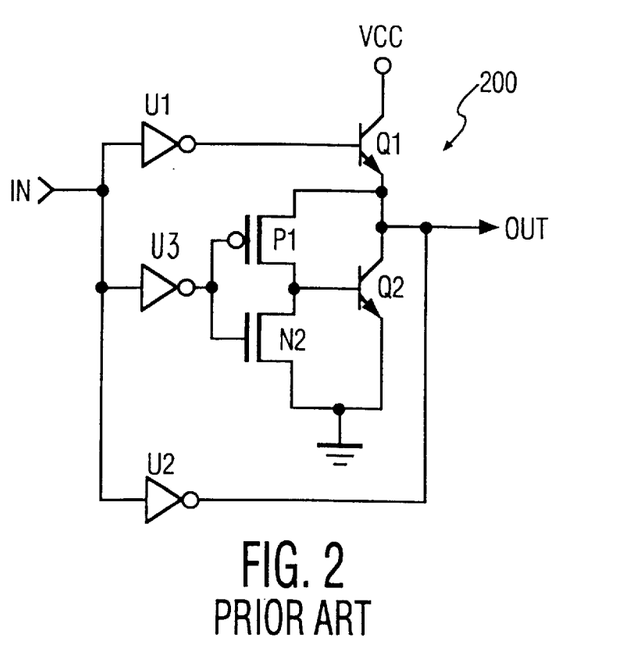
FIG. 2 is a circuit diagram of a prior art quasi-complementary BiCMOS logic circuit.

An alternative quasi-complementary BiCMOS circuit (QCBiCMOS) 200 is shown in FIG. 2 in an attempt to improve upon the conventional BiCMOS circuit. The QCBiCMOS circuit uses a PMOS transistor P1 driven by an inverter U3 so that a fully $V_{gs}$=$V_{cc}$ an be generated on the gate of P1 in order to improve the base drive to Q2. However, inverter U3 causes some propagation delay therefore sacrificing some speed.

Figure 3:
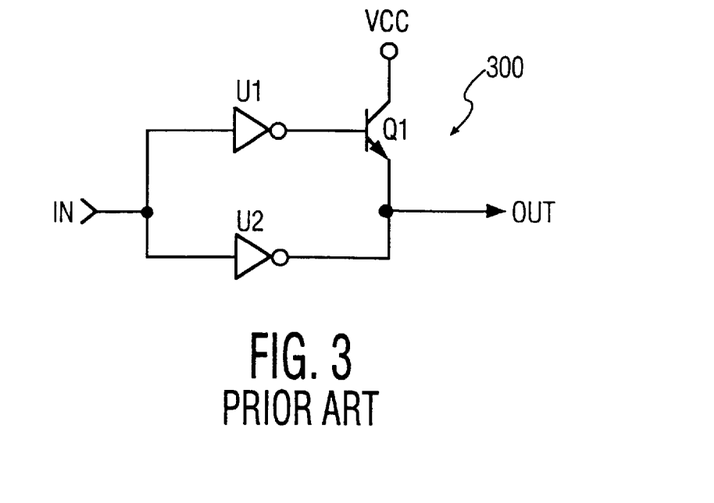
FIG. 3 is a circuit diagram of a prior art BiNMOS logic circuit.

Another attempt at improving the BiCMOS circuit 300 of FIG. 1 is shown in FIG. 3. This BiNMOS circuit utilizes an inverter U1 coupled between the input and the base of a transistor Q1 and an inverter U2 coupled between the input and output of the BiNMOS circuit. This circuit exhibits superior performance at very low $V_{cc}$ when $v_{cc}$ is below 2 volts but the NMOS inverter U2 used in the pull-down does not have the drive capability of complementary BiCMOS.

Accordingly, it would be desirable to provide a BiCMOS logic circuit which is capable of providing high-speed and high-drive BiCMOS operation for use in circuits with a $V_{cc}$ of 3.6 volts and below.

SUMMARY OF THE INVENTION

Generally speaking, in accordance with the invention, a BiCMOS logic circuit is provided which combines the features of full BiCMOS drive with maximum speed. The basic structure of a BiCMOS logic circuit in accordance with the invention includes a switching device which allows the pull-down device to be driven by the input signal directly without first having to switch an NMOS device.

The logic circuit operates between a first supply voltage and a second supply voltage and includes a pull-up device responsive to the input signal and having a main current path between a first supply voltage and the output terminal, a pull-down device having a main current path coupled between the second supply voltage and the output terminal and the switching device having a first main electrode coupled to the input terminal, a second main electrode coupled to the pull-down device and a control input for selectively conducting current from the input terminal to the pull-down device when the output signal equals a predetermined value.

Accordingly, it is an object of the invention to provide a BiCMOS logic circuit with greater speed and drive relative to other circuit designs at low supply voltages.

It is another object of the invention to provide a BiCMOS logic circuit which uses the gain of a bipolar transistor to augment the speed and drive capability of CMOS transistors.

It is yet another object of the invention to provide a BiCMOS logic circuit which utilizes an input signal to drive the pull-down portion of the circuit.

Still other objects and advantages of the invention will in part be obvious and will in part be apparent from the specifications and drawings.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 4:
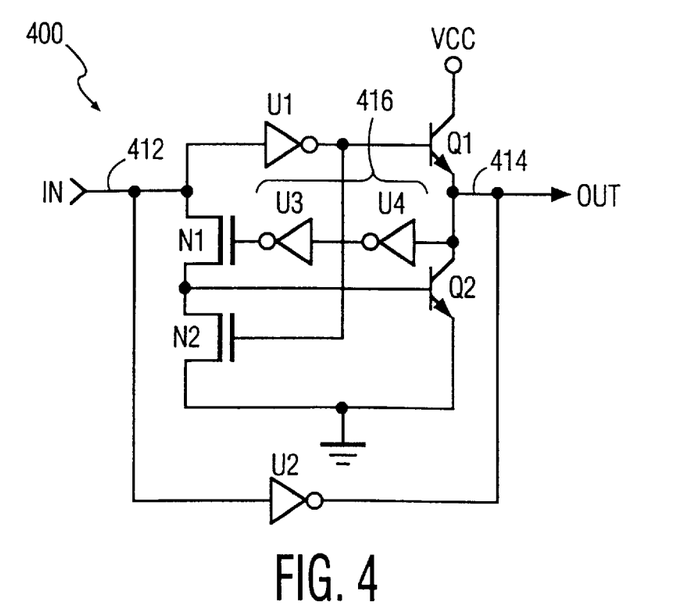
FIG. 4 is a circuit diagram of a BiCMOS inverter circuit in accordance with a first embodiment of the invention.

FIG. 4 shows a BiCMOS inverter circuit 400 in accordance with a first embodiment of the invention. Inverter circuit 400 includes an input terminal 412 and an output terminal 414. Input terminal 412 is connected to an input of inverter U1 which has an output coupled to the base of transistor Q1. The collector of transistor Q1 is coupled to a first voltage supply, in this example, $V_{cc}$, and the emitter of transistor Q1 is coupled to both output terminal 414, the collector of transistor Q2 and an inverter feedback chain 416 comprised of inverters U3 and U4. The output of the inverter feedback chain 416 is coupled to the gate of a transistor N1. The source of transistor N1 is coupled to input terminal 412 while the drain of transistor N1 is coupled to the source of transistor N2. The gate of transistor N2 is coupled to the output of inverter U1 while the drain of transistor N2 is coupled to both the emitter of transistor Q2 and the second voltage supply, in this example, ground.

It should be apparent that while the pull-up structure of FIG. 4 is the same as that shown in prior art FIG. 1, the pull-down structure differs in that with a low logic signal present at input terminal 412 and a high logic signal at output terminal 414, inverter feedback chain 416 provides a high logic signal to the gate of transistor N1 causing it to turn on and hold the base of transistor Q2 at the same voltage as the voltage present at input terminal 412. The gate of transistor N2 and the base of transistor Q1 would then be held high by inverter U1 causing N2 and Q1 to turn on and a high logic signal to be present at output terminal 414.

When the signal at input terminal 412 begins a low-to-high transition, N1 conducts directly from the input signal to the base of Q2 to cause the output high-to-low transition. In addition, inverter U1 turns off transistor Q1 and N2. Finally, when the logic signal present at output terminal 414 is pulled below the switching threshold of inverter U4, inverter U3 and inverter U4 switch, causing transistor N1 to turn off.

Figure 5:
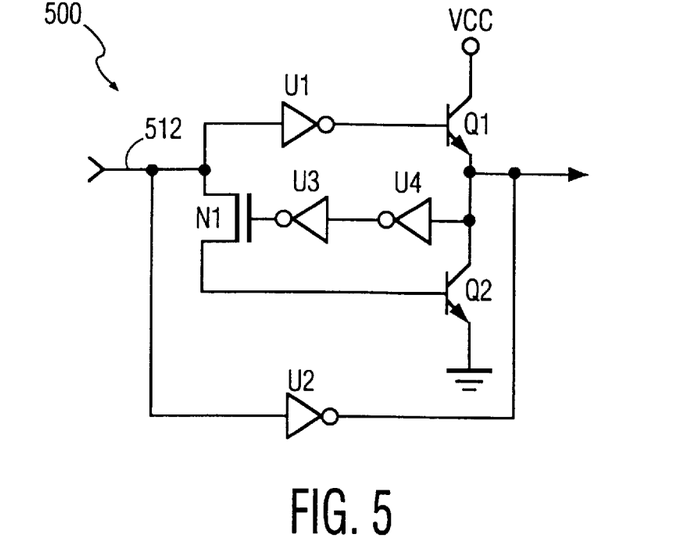
FIG. 5 is a circuit diagram of a BiCMOS inverter circuit in accordance with a second embodiment of the invention.

FIG. 5 shows a BiCMOS inverter circuit 500 in accordance with a second embodiment of the invention. Inverter circuit 500 is the same as inverter circuit 400 except that transistor N2 has been removed. In some applications, transistor N2 may not be necessary to keep transistor Q2 off. When the signal at input terminal 512 is low, transistor N1 keeps transistor Q2 off. When the input signal begins a high-to-low transition, transistor N1 would not turn on until inverter U3 and inverter U4 switch, however, the capacitive coupling from input terminal 512 via transistor N1 may be enough to hold Q2 off.

Figure 6:
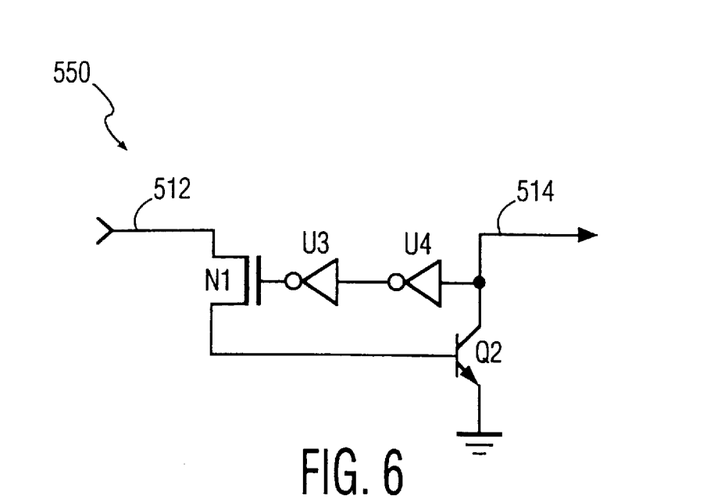
FIG. 6 is a circuit diagram of a BiMCOS pull-down circuit for use in a logic circuit in accordance with the invention.

The pull-down structure 550 of FIG. 5, namely transistor N1, transistor Q2 and inverters U3 and U4, is shown in an isolated view in FIG. 6. Pull-down structure 550 includes transistor N1 having a current path coupled between input terminal 512 and the base of transistor Q2 and a control input coupled through inverters U3 and U4 to output terminal 514. The operation of this circuit is discussed above in great detail with respect to FIGS. 4 and 5.

Figure 7:
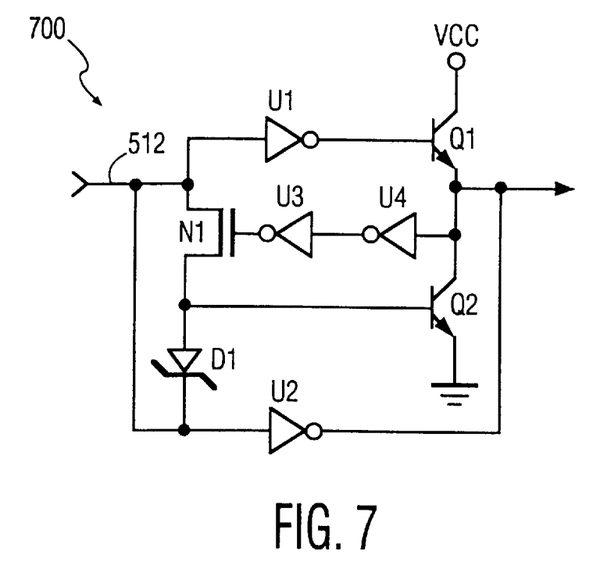
FIG. 7 is a circuit diagram of a BiCMOS inverter circuit in accordance with a third embodiment of the invention.

Reference is now had to FIG. 7 which shows a circuit diagram of a BiCMOS inverter circuit 700 in accordance with a third embodiment of the invention. Inverter circuit 700 is essentially the same circuit as that shown in FIG. 5 with the addition of a schottky diode D1 interposed between the drain of transistor N1 and the input of inverter U2. Schottky diode D1 provides additional capacitive coupling so that transistor N1 can keep transistor Q2 off.

Figure 8:
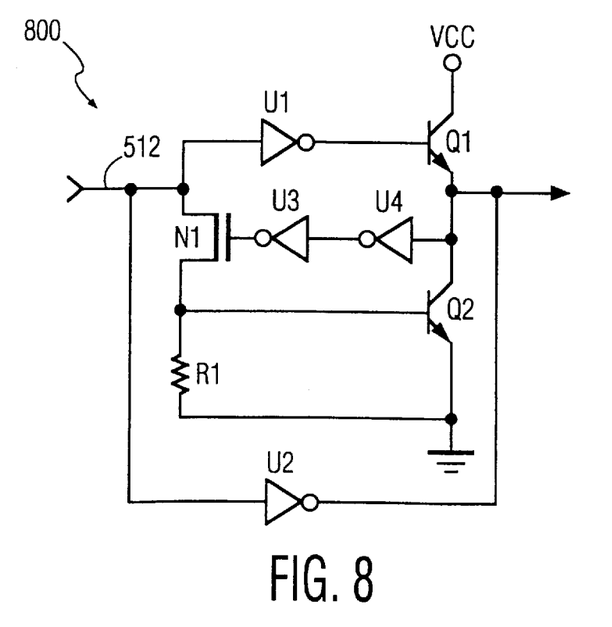
FIG. 8 is a circuit diagram of a BiCMOS inverter circuit in accordance with a fourth embodiment of the invention.

FIG. 8 shows a circuit diagram of a BiCMOS logic circuit in accordance with a fourth embodiment of the invention. Logic circuit 800 is essentially the same as logic circuit 400 except that a resistor R1 is coupled between the drain of transistor N1 and the second supply voltage in place of transistor N2. Resistor R1 acts to hold Q2 off when the input is making its transition.

Figure 9:
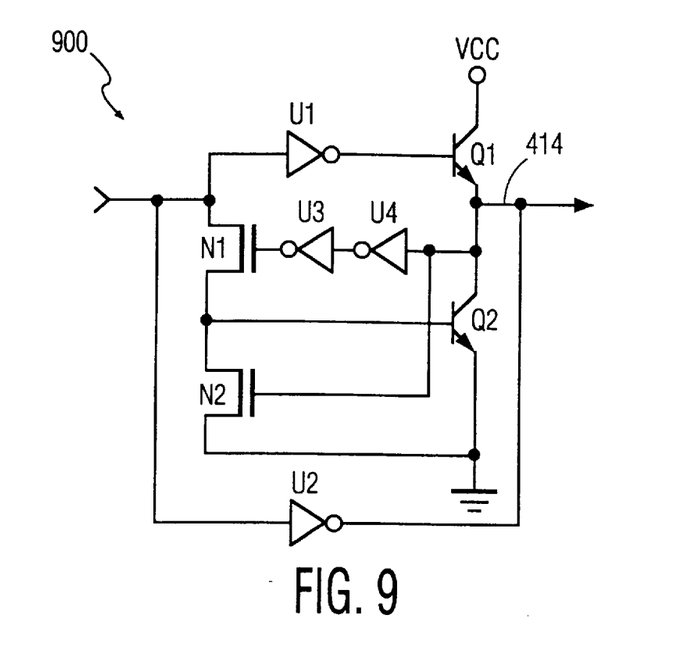
FIG. 9 is a circuit diagram of a BiCMOS inverter circuit in accordance with a fifth embodiment of the invention.

FIG. 9 shows a circuit diagram of a BiCMOS logic circuit in accordance with a fifth embodiment of the invention. Logic circuit 900 is essentially the same as logic circuit 400 shown in FIG. 4 with the exception that the gate of transistor N2 is coupled to output terminal 414.

Figure 10:
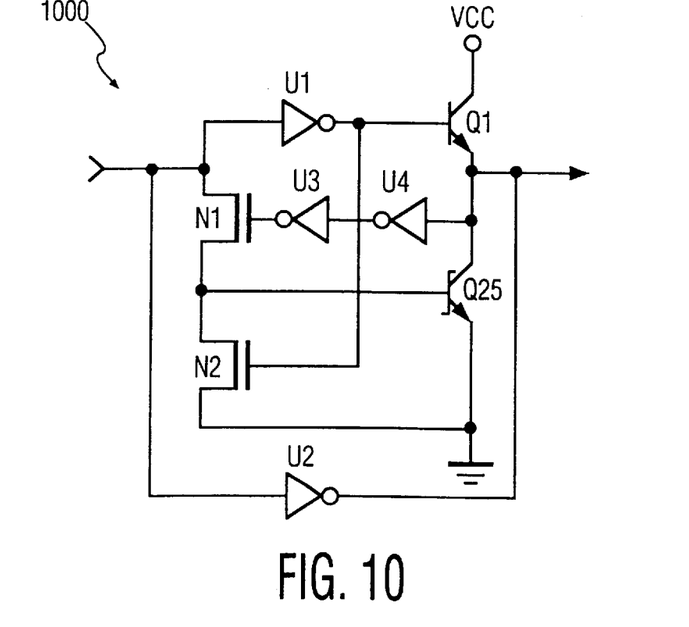
FIG. 10 is a circuit diagram of a BiCMOS inverter circuit in accordance with a sixth embodiment of the invention.

Reference is now had to FIG. 10 which shows a sixth embodiment of the BiCMOS logic circuit. Logic circuit 100 is also essentially the same as logic circuit 400 in FIG. 4 except that transistor Q2 is replaced by schottky transistor Q2S.

Figure 11:
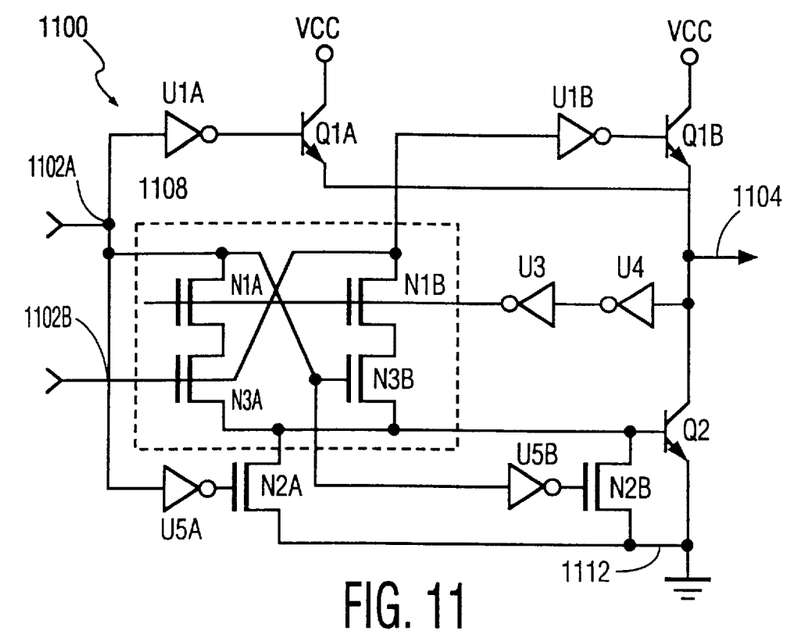
FIG. 11 is a circuit diagram of a BiCMOS NOR logic circuit in accordance with the invention.

Reference is now had to FIG. 11 which shows a NAND gate circuit 1100 in accordance with the invention. NAND gate circuit 1100 includes a pair of input terminals, input terminal 1102A and input terminal 1102B. Input terminal 1102A is coupled to the base of a bipolar transistor Q1A through an inverter U1A. The collector of bipolar transistor Q1A is coupled to a first supply voltage $V_{cc}$ while the emitter is coupled to an output terminal 1104.

Input terminal 1102B is coupled to the base of a bipolar transistor Q1B through an inverter U1B. The collector of bipolar transistor Q1B is coupled to first supply voltage $V_{cc}$.

Also included in NAND gate circuit 1100 is a logic device 1108 including an NMOS transistor N1A, NMOS transistor N1B, NMOS transistor N3A and NMOS transistor N23B. The gates of NMOS transistors N1A and N1B are coupled to output terminal 1104 through a delay feedback device 1106 which includes, as an example, two inverters U3 and U4 in series configuration. NMOS transistor N1A has a main current path coupled between input terminal 1102A and an end of a main current path of NMOS transistor N3A which has a gate coupled to input terminal 1102B and another end of its main current path coupled to the base of a bipolar transistor Q2. Bipolar transistor Q2 has a collector coupled to output terminal 1104 and an emitter coupled to a second supply voltage 1112, for example, ground.

NMOS transistor N1B has a main current path coupled between input terminal 1102B and to an end of a main current path of NMOS transistor N3B. NMOS transistor N3B has a gate coupled to input terminal 1102A and another end of the main current path coupled to the base of bipolar transistor Q2.

NAND gate circuit 1100 also includes NMOS transistor N2A which includes a gate coupled to input terminal 1102A via inverter U5A and a main current path interposed between the base of bipolar transistor Q2 and second voltage supply 1112 and an NMOS transistor N2B having a gate coupled to input terminal 1102B via inverter U5B and a main current path interposed between the base of bipolar transistor Q2 and the second voltage supply 1112. The circuit operates similarly to logic circuit 400 except that input terminals 1102A and 1102B will conduct current to transistor Q2 only when both inputs A and B are at a high logic level.

Figure 12:
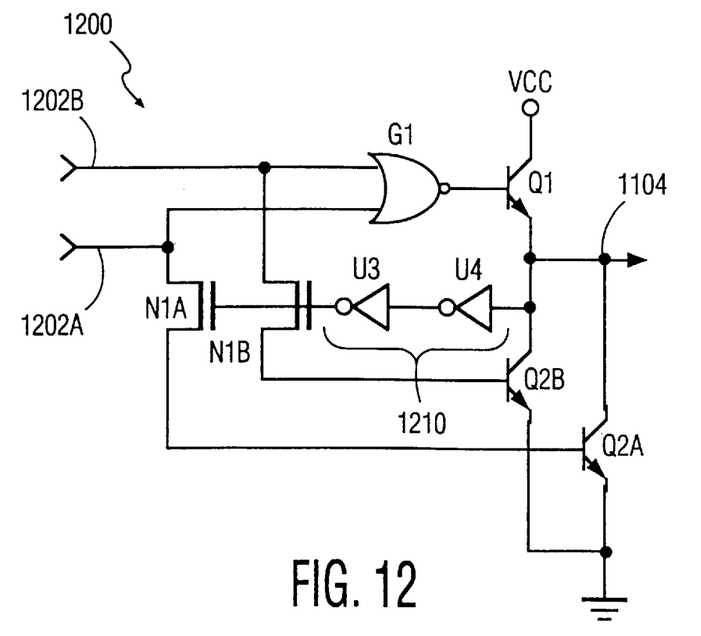
FIG. 12 is a circuit diagram of a BiCMOS NAND logic circuit in accordance with the invention.

Reference is now had FIG. 12 which shows a BiCMOS NOR circuit. NOR circuit 1200 includes two input terminals 1202A and 1202B and an output terminal 1204. NOR circuit 1200 also includes a pull-up device, transistor Q1, two pull-down devices (transistor Q2A and transistor Q2B) and NMOS transistors N1A and N1B. Input terminal 1202A is coupled to the source of NMOS transistor N1A which has a drain coupled to the base of transistor Q2A and a gate coupled to output terminal 1204 through a feedback delay circuit 1210 which includes inverters U3 and U4. Likewise, input terminal 1202B is coupled to the source of NMOS transistor N1B which has a drain coupled to the base of transistor Q2B and a gate coupled to output terminal 1204 through feedback delay circuit 1210. Input terminals 1202A and 1202B are also coupled to an input of NOR gate G1 which has an output coupled to the base of transistor Q1. The collector of Q1 is coupled to $V_{cc}$ and the emitter of transistor Q1 is coupled to output terminal 1204. NOR circuit 1200 operates on the same principle as inverter circuit 400 in that transistors Q2A and Q2B are driven by inputs A and B, respectively, when there is a high logic signal applied to input terminals 1202A and 1202B, respectively. The transistor corresponding to the input terminal at the high logic signal will then conduct. Therefore, as is the case with a NOR gate, when either or both of inputs A and B are high, either transistor Q2A or transistor Q2B, or both, pull output terminal 1204 dow to the second supply terminal. Likewise, when inputs A and B are not at a high logic value, transistor Q1 is on, pulling output terminal 1204 up to $V_{cc}$.

It will thus be seen that the objects set forth above among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention, which, as a matter of language, might be said to fall therebetween.

What is claimed is:

1. A logic circuit for receiving an input signal at an input terminal and for outputting an output signal at an output terminal, said output signal being responsive to said input signal, said circuit comprising:
   a pull-up device having a control input responsive to said input signal and a main current path coupled between a first supply voltage and said output terminal;
   a pull-down device having a control input and a main current path coupled between a second supply voltage and said output terminal;
   a switching device having a first conducting electrode coupled to said input terminal, a second conducting electrode coupled to said pull-down device and a control input coupled to said output terminal for selectively conducting current from said input terminal to said control input of said pull-down device when said output signal equals a predetermined value; and
   a feedback device coupled between said output terminal and said control input of said switching device for controlling the conducting of current through said switching device from said input terminal to said control input of said pull-down device.

2. The circuit of claim 1, further including a first inverter coupled between said input terminal and said control input of said pull-up device.

3. The circuit of claim 1, wherein said switching device includes a first NMOS transistor having a gate coupled to said feedback device, said first conducting electrode coupled to said input terminal and said second conducting electrode coupled to said pull-down device.

4. The circuit of claim 3, wherein said switching device includes a second NMOS transistor having a third conducting electrode coupled to said pull-down device and a fourth conducting electrode coupled to said control input of said pull-down device.

5. The circuit of claim 3, further including a first inverter coupled between said input terminal and said pull-up device and wherein said pull-up device is a first bipolar transistor having a base coupled to said first inverter, a collector coupled to said first supply voltage and an emitter coupled to said output terminal.

6. The circuit of claim 1, wherein said pull-down device includes a bipolar transistor having a base coupled to said switching device, a collector coupled to said output terminal and an emitter coupled to said second supply voltage.

7. The circuit of claim 5, wherein said pull-down device includes a second bipolar transistor having a base coupled to said second conducting electrode of said first NMOS transistor, a collector coupled to said output terminal and an emitter coupled to said second supply voltage.

8. The circuit of claim 3, further including a schottky diode coupled between said second conducting electrode of said first NMOS transistor and said input terminal.

9. The circuit of claim 3, further including a resistive element coupled between said second conducting electrode of said first NMOS transistor and said second supply voltage.

10. The circuit of claim 3, wherein said pull-down device includes a schottky transistor having a base coupled to said second conducting electrode of said first NMOS transistor, a collector coupled to said output terminal and an emitter coupled to said second supply voltage.

11. A pull-down circuit having an input terminal for receiving an input signal and an output terminal for receiving an output signal responsive to said input signal, said circuit comprising:
   a bipolar pull-down device having a main current path coupled between said output terminal and a voltage supply and having a control input; and
   a switching device having a first conducting electrode coupled to said input terminal and a second conducting electrode coupled to said control input of said pull-down device, said switching device including a control input coupled to said output terminal for connecting said input terminal to said control input of said bipolar pull-down device when said output signal equals a logic high value, said control input of said pull down device not being coupled to any other source of electric potential for rendering said pull down device conductive, whereby for a logic high output at said output terminal said pull-down device is rendered conductive by a low-to-high transition of said input terminal without first switching said switching device.

12. The circuit of claim 11, wherein said switching device has a control input and further including a delay feedback device coupled between said control input of said switching device and said output terminal for controlling the conducting of current from said input terminal to said control input of said bipolar pull-down device.

13. The circuit of claim 12, wherein said delay feedback device includes a first inverter and a second inverter.

14. The circuit of claim 11, wherein said switching device includes a first NMOS transistor having a gate coupled to said output, a first conducting electrode coupled to said input terminal and a second conducting electrode coupled to said control input of said bipolar pull-down device.

15. The circuit of claim 12, wherein said switching device includes a first NMOS transistor having a gate coupled to said delay feedback device, a first conducting electrode coupled to said input terminal and a second conducting electrode coupled to said control input of said bipolar pull-down device.

16. The circuit of claim 14, wherein said switching device includes a second NMOS transistor having a main current path between said second supply voltage and said second conducting terminal.

17. The circuit of claim 14, wherein said bipolar pull-down device is a bipolar transistor having a base coupled to said second conducting electrode of said first NMOS transistor, a collector coupled to said output terminal and an emitter coupled to said second voltage supply.

18. The circuit of claim 17, further including a schottky diode coupled between said second conducting electrode of said first NMOS transistor and said input terminal.

19. The circuit of claim 17, further including a resistive element coupled between said second conducting electrode of said first NMOS transistor and said input terminal.

20. The circuit of claim 14, wherein said bipolar pull-down device includes a schottky transistor having a base coupled to said second conducting electrode of said first NMOS transistor, a collector coupled to said output terminal and an emitter coupled to said voltage supply.

21. The circuit of claim 11, further including an inverter coupled between said input terminal and said output terminal.

22. The circuit of claim 1, further including an inverter coupled between said input terminal and said output terminal.

23. A logic circuit operating between a first supply voltage and a second supply voltage for receiving a plurality of input signals at corresponding input terminals and for outputting an output signal at an output terminal, said output signal being responsive to said input signals, said circuit comprising:

a pull-up device having a main current path coupled between said first supply voltage and said output terminal;

a pull-down device having a plurality of control inputs and a plurality of main current paths coupled in parallel between a second voltage supply and said output terminal;

a switching device having a first conducting electrode coupled to said input terminals, a second conducting electrode coupled to said pull-down device and a control input coupled to said output terminal for selectively conducting current from said input terminals to said control inputs of said pull-down device when said output signal equals a predetermined value; and a delay feedback device coupled between said control input of said switching device and said output terminal for controlling the conducting of current through said switching device from said input terminal to said control input of said pull-down device.

24. The circuit of claim 25, wherein said pull-up device has a control input and further including a logic gate having an input coupled to said plurality of inputs and an output coupled to said control input of said pull-up device.

25. The circuit of claim 24, wherein said logic gate is a NOR gate.

26. The circuit of claim 25, wherein said switching device includes a first MOS transistor having a gate coupled to said delay feedback device, a first conducting electrode coupled to one of said plurality of input terminals and a second conducting electrode coupled to one of said plurality of control inputs of said pull-down device and a second MOS transistor having a gate coupled to said delay feedback device and a third conducting electrode coupled to another of said plurality of input terminals and a fourth conducting electrode coupled to another of said plurality of control inputs of said pull-down device.

27. The circuit of claim 26, wherein said pull-down device includes a first bipolar transistor having a collector coupled to said output terminal, a base coupled to said second conducting electrode of said first MOS transistor and an emitter coupled to said second voltage supply and a second bipolar transistor having a collector coupled to said output terminal, a base coupled to said second conducting electrode of said second MOS transistor and an emitter coupled to said second voltage supply.

28. The circuit of claim 25, wherein said feedback delay device includes two inverters in series configuration.

29. The circuit of claim 27, wherein said first MOS transistor and said second MOS transistor are NMOS devices.

30. A logic circuit operating between a first supply voltage and a second supply voltage for receiving a plurality of input signals at a corresponding plurality of input terminals and for outputting an output signal at an output terminal, said output signal being responsive to said input signals, said circuit comprising:

a pull-up device having a main current path coupled between said first supply voltage and said output terminal;

a pull-down device having a control input and a main current path coupled between said second supply voltage and said output terminal;

a switching device having a first conducting electrode coupled to said input terminals, a second conducting electrode coupled to said pull-down device and a control input coupled to said output terminal for selectively conducting current from said input terminals to said control input of said pull-down device when said output signal equals a predetermined value; and said pull-up device further including a first pull-up circuit and a second pull-up circuit and further including a first inverter coupled between one of said plurality of input terminals and said first pull-up circuit and a second inverter coupled between another of said plurality of input terminals and said second pull-up circuit.

31. The circuit of claim 30, further including a delay feedback device coupled between said control input of said switching means and said output terminal for controlling the conducting of current from said plurality of input terminals to said control input of said pull-down device.

32. The circuit of claim 31, wherein said switching means includes a first MOS transistor having a control electrode coupled to said delay feedback device, a first conducting electrode coupled to said one of said plurality of input terminals and a second conducting electrode, a second MOS transistor having a control electrode coupled to another of said plurality of input terminals and a main current path coupled between said control electrode of said first MOS transistor and said pull-down device, a third MOS transistor having a control electrode coupled to said delay feedback device and a main current path coupled to said pull-up device and a fourth MOS transistor having a control electrode coupled to said one of said plurality of input terminals and a main current path coupled between said main current path of said third MOS transistor and said pull-down device.

33. The circuit of claim 32, wherein said first MOS transistor, said second MOS transistor, said third MOS transistor and said fourth MOS transistor are NMOS transistors.

34. The circuit of claim 32, wherein said pull-down device includes a bipolar transistor having a base coupled to said second conducting electrode of said first NMOS transistor, a collector coupled to said output terminal and an emitter coupled to said second supply voltage.

35. The circuit of claim 32, wherein said switching device includes a first NMOS transistor having a gate coupled to said output, a first conducting electrode coupled to said input terminal and a second conducting electrode coupled to said pull-down device.

36. The circuit of claim 32, further including a further logic circuit coupled between said input terminal and said output terminal.

37. The circuit of claim 25, wherein said switching device includes a first MOS transistor having a gate coupled to said output terminal, a first conducting electrode coupled to one of said plurality of input terminals and a second conducting electrode coupled to one of said plurality of control inputs of said pull-down device and a second MOS transistor having a gate coupled to said output terminal and a third conducting electrode coupled to another of said plurality of input terminals and a fourth conducting electrode coupled to another of said plurality of control inputs of said pull-down device.

38. The circuit of claim 25, wherein said pull-down device includes a bipolar transistor having a base coupled to said switching device, a collector coupled to said output terminal and an emitter coupled to said second supply voltage.

39. A logic circuit operating between a first voltage supply and a second voltage supply for receiving a plurality of input signals at a corresponding plurality of input terminals and for outputting an output at an output terminal, said output signal being responsive to said input signals, said circuit comprising:

a pull-up device having a control input and a main current path coupled between said first voltage supply and said output terminal;

a pull-down device having a control input and a main current path coupled between said output terminal and said second voltage supply;

a switching device having a main current path coupled between said plurality of input terminals and said pull-down device and a control input coupled to said output terminal for selectively conducting current from said input terminals to said control input of said pull-down device when said output signal equals a predetermined value; and a feedback device coupled between said control input of said switching means and said output terminal for controlling the conducting of current through said switching device from said plurality of input terminals to said control input of said pull-down device.

40. The circuit of claim 39, further including a logic circuit having a plurality of inputs, each input coupled to one of said input terminals and an output coupled to said control input of said pull-up device.

41. The circuit of claim 39, wherein said switching means includes a first MOS transistor having a control electrode coupled to said delay feedback device, a first conducting electrode coupled to one of said plurality of input terminals and a second conducting electrode coupled to said one of said control inputs of said pull-down device and a second MOS transistor having a control electrode coupled to said delay feedback device, a first conducting electrode coupled to another of said plurality of input terminals and a second conducting electrode coupled to another of said control inputs of said pull-down device.

42. The circuit of claim 41, wherein said first MOS transistor and said second MOS transistor are NMOS transistors.

43. A pull-down circuit having a plurality of input terminals for receiving corresponding input signals and an output terminal for receiving an output signal, said output signal being responsive to said plurality of input signals, said circuit comprising:

a bipolar pull-down device having a main current path coupled between said output terminal and a supply voltage and having a control input; and a switching device having a first conducting electrode coupled to the input terminals and a second conducting electrode coupled to said control input of said pull-down device and a control input coupled to said output terminal for selectively conducting current from said input terminals to said control input of said pull-down device when said output signal equals a logic high, said control input of said switching device not being coupled to any other source of electric potential for rendering said pull down device conductive, whereby for a logic high output at said output terminal said pull down device is rendered conductive by a low-to-high transition of said input terminal without first switching said switching device.

* * * * *